(12) United States Patent
Bridgewater, Jr.

(10) Patent No.: US 6,664,811 B1
(45) Date of Patent: Dec. 16, 2003

(54) PRECOMP CUTBACK DIFFERENTIAL DRIVER

(75) Inventor: Walter F. Bridgewater, Jr., San Jose, CA (US)

(73) Assignee: Adaptec, Inc., Milpitas, CA (US)

( * ) Notice: Subject to any disclaimer, the term of this patent is extended or adjusted under 35 U.S.C. 154(b) by 18 days.

(21) Appl. No.: 10/121,485

(22) Filed: Apr. 12, 2002

(51) Int. Cl.[7] .............................................. H03K 19/094
(52) U.S. Cl. .............................. 326/86; 326/82; 326/26; 326/28
(58) Field of Search ............................... 326/26–28, 30, 326/82–83, 86, 90; 327/107

(56) References Cited

U.S. PATENT DOCUMENTS

| | | | | |
|---|---|---|---|---|
| 5,949,253 A | * | 9/1999 | Bridgewater, Jr. ............ | 326/86 |
| 6,366,128 B1 | * | 4/2002 | Ghia et al. .................... | 326/83 |

* cited by examiner

*Primary Examiner*—Anh Tran
(74) *Attorney, Agent, or Firm*—Martine & Penilla, LLP

(57) ABSTRACT

A precompensation cutback differential driver includes a main buffer, a set of secondary buffers, and control logic circuitry. The main buffer is arranged to drive a first input differential signal for output as a differential output signal over a differential output line. The set of secondary buffers is arranged to receive second input differential signals, tristate signals, and mode signals with each secondary buffer receiving one second input differential signal, one tristate signal, and one mode signal. The secondary buffers are further configured to operate in a normal slew rate or a slow slew rate. Each tristate signal is configured to drive the associated secondary buffer to high impedance to turn off the associated secondary buffer when the tristate signal is asserted. Additionally, each secondary buffer is configured to operate in a slow slew rate in response to the associated mode signal. The control logic circuitry is arranged to receive input signals and a clock signal for generating the first input differential signal, second input differential signals, tristate signals, and the mode signals such that the secondary buffers cutback the differential output signal on the differential output line when the input signals are in a steady state for more than a specified number of clock cycles. In this configuration, the secondary buffers are arranged to cutback the differential output signal by tristating in response to the tristate signals and by operating in the slow slew rate in response to the mode signals.

23 Claims, 10 Drawing Sheets

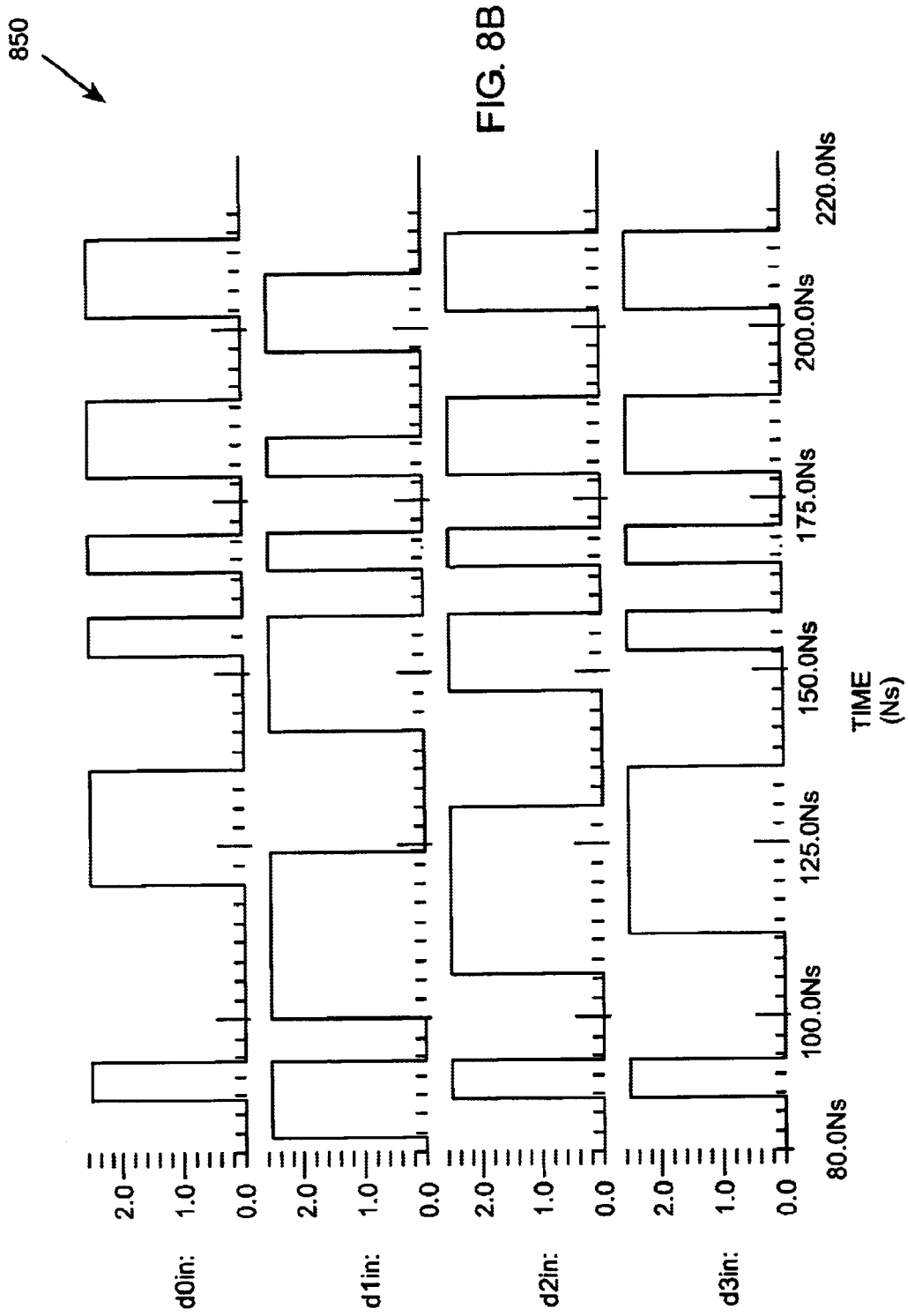

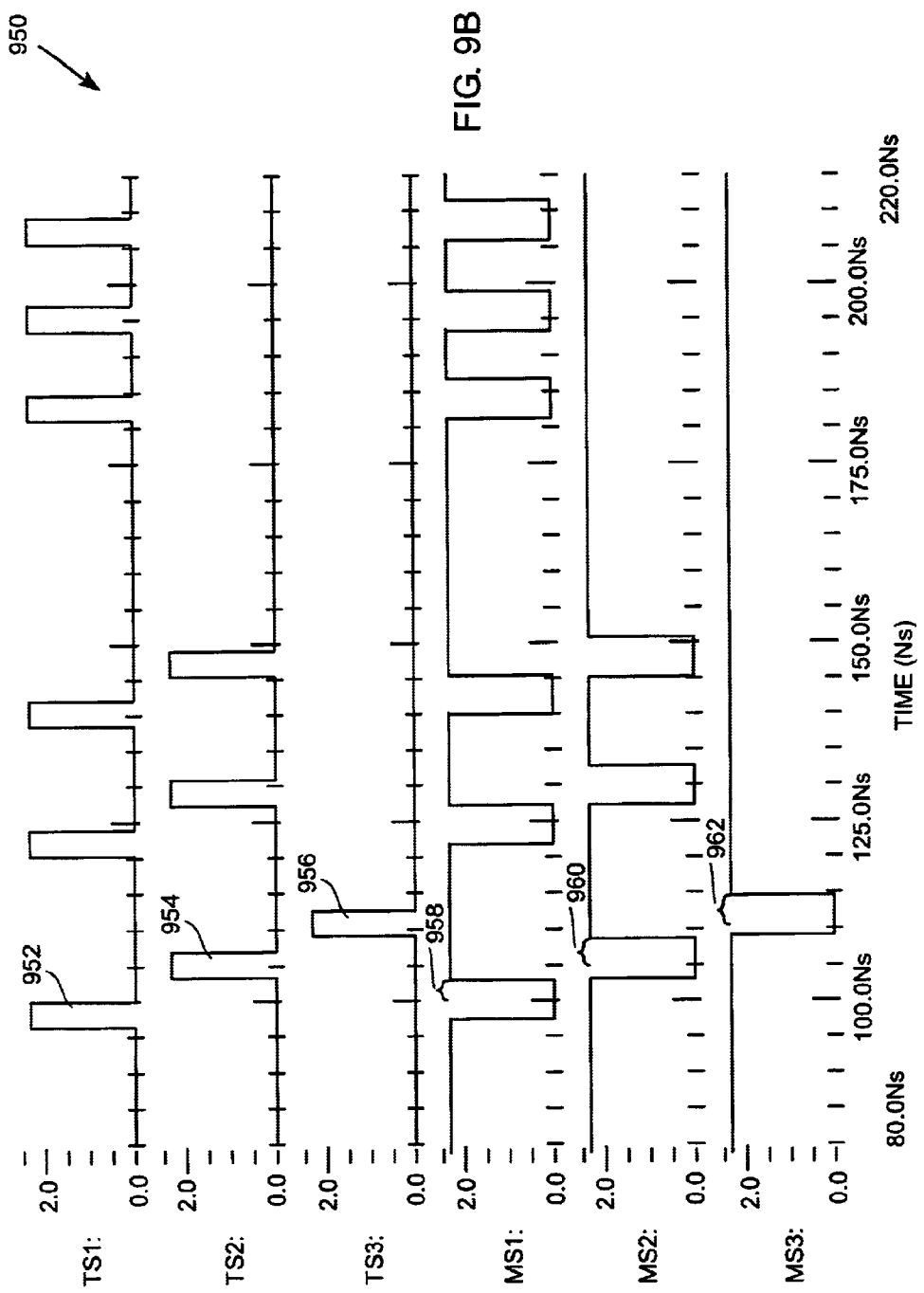

PRECOMP CUTBACK DIFFERENTIAL DRIVER

BACKGROUND OF THE INVENTION

1. Field of the Invention

This invention relates generally to data communications and more particularly to transmission of high frequency signal over transmission lines for high-speed data communication.

2. Description of the Related Art

Modem computer systems often utilize one or more buses to connect to peripheral devices to enhance its resources. For example, the resources of a computer system may be substantially increased by connecting the computer system to one or more peripheral devices such as disk drives, tape drives, printers, scanners, optical drives, and the like. These peripheral devices are attached to the computer system by means of a peripheral bus (e.g., cable).

One of the most widely used peripheral buses is the well known small computer systems interface (SCSI) bus, which is defined in conformity with well known SCSI protocols (e.g., SCSI-1, SCSI-2, SCSI-3, etc.). These SCSI protocols are universal parallel interface standards for connecting disks and other high performance peripherals to computers and are incorporated herein by reference. The SCSI protocols are designed to provide an efficient peer-to-peer I/O interface between a host computer and peripheral devices in a computer system.

FIG. 1 shows a block diagram of a conventional computer system 10 including a host computer 12, one or more SCSI devices 14, 16, and 18, and a SCSI bus 20. The host computer 12 includes an SCSI host adapter 22 for communicating with the SCSI peripheral devices 14, 16, and 18. The host adapter 22 in the computer system 10 controls communication between the host computer 12 and the SCSI devices 14, 16, and 18. For example, the host adapter 22 provides a physical connection between the host computer 12 and the SCSI bus 20. In addition, it is configured to receive data, address, and control signals from the host computer 12 and convert the signals into corresponding SCSI compatible data, address, and control signals. Conversely, the SCSI host adapter 22 is also configured to receive SCSI compatible data, address, and control signals from the SCSI devices 14, 16, and 18 through the SCSI bus 20 and convert them into corresponding host-bus compatible data, addressing, and control signals. The SCSI host adapter 16 is well known in the art and may be implemented, for example, by using AIC-7890A™ packaged semiconductor device, which is available from Adaptec Inc., of Milpitas, Calif. Although the computer system 10 is illustrated using a SCSI bus, it should be appreciated that computer system 10 may employ other interface standards having characteristics similar to SCSI such as Intelligent Peripheral Interface (IPI) standard.

In the computer system 10, the host adapter 22 and SCSI devices 14, 16, and 18 typically use bus drivers and bus receivers to allow devices to communicate data and control signals. FIG. 2 shows a more detailed schematic diagram of the host computer 12 and peripheral device 18 connected via the SCSI bus 20 for driving and receiving a signal. The SCSI bus 20 is a 16-bit SCSI bus with a plurality of control and data lines 52, 54, 56, 58, 60, and 62 to transmit control and data signals. For example, data lines 52 to 54 are used to transmit data signals from data[0] through data[15] while parity line 56 is used to carry a parity signal. On the other hand, control lines 58 to 62 are used to transmit control signals. For example, the control line 58 is used to carry ACK (acknowledge) signal while the control line 60 transmits REQ (request) signal. Other well known SCSI control signals are also carried on control lines 62.

Both the host computer 12 and peripheral device 18 typically include a driver and a receiver for each data and control line in the bus 20. In the example, the host computer 12 is shown with a driver 72 and the peripheral device 78 is shown with a receiver 78 to illustrate transmission of a data signal over data line 54 from the driver 70 to the receiver 78. It should be noted, however, that the signal transmission may proceed in either direction because the host adapter 22 and peripheral devices 14, 16, and 18 each typically includes a driver and receiver pair for bi-directional communication.

The output of the driver 72 is electrically coupled to the data line 54 while the input of the receiver 78 is electrically coupled to the data line 54 in the bus 20. To illustrate transmission of a signal value 70 over bus line 54, the driver 72 receives the signal value 70 from the host computer 12 (i.e., host adapter 22) and drives the signal value 70 onto the data line 54 corresponding to data[15]. The receiver 78 then receives and outputs the signal value 70 from the data line 54 for use as data[15] by the peripheral device 18.

FIG. 3 shows a more detailed schematic circuit diagram of the driver 72 and receiver 78 for transmitting signal value 70 over line 54. Typically, SCSI bus 20 employs a voltage differential technique to transmit signals. Accordingly, the driver 72 transmits the signal value 70 using a signal line 82 and a complement signal line 84 to the receiver 78. In this configuration, the signal lines 82 and 84 are used to transmit information for bus line 54. Other bus lines typically employ a pair of signal lines to transmit information.

To determine which devices are asserting which bits on the bus during arbitration phase of SCSI protocol, the SCSI bus also implements a bias voltage in the termination at each end of the SCSI bus. Without a termination bias voltage, it would be difficult to determine which device is asserting a data bit because bits not being asserted would be floating. To provide the termination bias voltage, computer 12 includes a voltage source V(A) 86 (e.g., 1.5 volts) and a voltage source V(B) 88 (e.g., 1.0 volt) which are connected in series using a resistor 90 (e.g., 270 ohms), resistor 92 (e.g., 138 ohms), and resistor 94 (e.g., 270 ohms). This termination bias voltage circuit is connected to signal lines 82 and 84 as shown. Thus, a junction 91 is typically at 1.3 volts due to the termination bias voltage, and a junction 93 is typically at 1.2 volts due to the termination bias voltage. The termination bias voltage also results in an approximate termination resistance of 110 ohms.

Similarly, the peripheral device 18 also includes a termination bias voltage. As in the host computer 12, resistors 95, 96, and 97 connect in series between voltage sources V(A) and V(B). These voltages and resistances may have similar values as for the host computer 12 and are connected to signal lines 82 and 84 as shown. Also shown in FIG. 3 are multiple bus taps 98 symbolizing the variety of other devices, computers, and peripherals that may also tap onto SCSI bus 20.

In the driver and receiver configuration, the driver 72 uses a low-voltage swing differential (LVD) driver and the receiver 78 is a low offset voltage, high-speed, differential input receiver. The driver for this type of SCSI bus uses an asymmetrical output, where one direction has more drive strength than the other. The reason for this asymmetrical output is because of the termination bias voltage discussed above.

The termination bias voltage and the asymmetrical driver output that it necessitates often cause undesirable effects. The reason for the need for a termination bias voltage has to do with the dual use of the data lines of a SCSI bus. A SCSI bus includes data lines that are used during a data phase of communication, i.e., high-speed transmission of data. A SCSI bus also includes various control lines that are used to transmit control signals at a lower speed during a protocol phase of communication on the bus. However, the data lines of a SCSI bus have a dual use. During the protocol phase of communication, the data lines are also used to transmit control signals used for arbitration on the bus. Thus, the data lines of a SCSI bus must be able to operate in a high-speed data phase and also in a low-speed protocol phase. Operation of these lines in the protocol phase requires a termination bias voltage.

The data lines have this dual use because of the way peripherals indicate when they wish to use the SCSI bus. When a peripheral on a SCSI bus wishes to use the bus, it asserts one of the data lines. Each peripheral on the bus is associated with one of the data lines, thus it can be determined which peripheral wants to use the bus by which data line is being asserted. However, when one peripheral is asserting one data line, the other data signals must be driven to a known state so that the SCSI bus and its attached devices can determine which data line is being asserted. In other words, if the data lines are simply floated it would be difficult to determine which of many data lines is being asserted.

Therefore, pull-up voltages are used at each end of the SCSI bus so that any non-driven data lines are put into a negated state. Thus, when one peripheral device asserts one data line, all of the other data lines will be in a negated state and it may then be determined which peripheral wishes to use the bus. These pull-up voltages are called termination bias voltages and are due to the dual use of the data lines of a SCSI bus. A termination bias voltage is present at each end of a SCSI bus and is used with single-ended drivers and also with differential drivers.

Conventional SCSI buses typically employ high-voltage differential drivers. A high-voltage driver may have a voltage differential of about 2.5 volts minimum, whereas a low-voltage differential driver may have a differential from about 260 mV to 780 mV. Differential drivers and receivers are described in more detail in U.S. Pat. No. 5,949,253 to Walter F. Bridgewater, Jr. and entitled "Low Voltage Differential Driver with Multiple Drive Strengths," which is incorporated herein by reference.

As described in U.S. Pat. No. 5,949,253, the use of high speed communication buses such as SCSI bus often generates undesirable "first pulse problem." The first pulse problem is generally caused by too much attenuation of a signal for its first pulse after a stead state. If a driver maintains a value for several clock cycles, for example, the first pulse after the constant signal value when the output driver changes its state will not be of good quality. That is, when the signal finally changes after being in one state for a number of clock cycles, the next pulse will typically be of poor quality. This may lead to inaccurate transmission of transmission signals.

The first pulse problem is typically caused by the frequency roll-off or high frequency attenuation characteristics of transmission cables. This attenuation is combined with a last signal level being driven all the way to its maximum limits while the cable is being driven in a constant state. If a cable is driven to a constant state for a long time, it goes to its maximum possible voltage level. Then, when a high frequency signal is driven in the other direction, it generally cannot drive the maximum voltage level in the other direction. Thus, the amount of over drive in the other direction is small.

FIG. 4 shows a series of pulses 100 for a signal coming from a driver of a low-voltage differential (LVD) SCSI bus. The SCSI bus uses a low-voltage swing differential for communication, which results in a particular value to be transmitted being represented by the complementary pulses shown. Signal 101 and $\overline{\text{signal}}$ 102 may originate from a driver such as driver 72 of FIG. 3. By convention, signal 101 represents possible pulses occurring on signal line 82 while $\overline{\text{signal}}$ 102 represents the complement of these pulses as might be occurring on signal line 84.

In a steady state, signal and $\overline{\text{signal}}$ have a difference of about 500 mV 103. This voltage difference for a pair of signals, representing a value to be transmitted over a differential bus, allows the receiver to accurately determine the value to be transmitted. If signal and $\overline{\text{signal}}$ do not have a sufficient voltage differential due to the first pulse problem, then the receiver may not be able to determine what value is being transmitted from the driver. For example, in FIG. 4, signal and $\overline{\text{signal}}$ have remained in a constant state until a first pulse 104 occurs. At first pulse 104, signal 101 is only able to obtain a voltage level 105 which is far lower than the voltage level that $\overline{\text{signal}}$ 102 had maintained during its steady state. Likewise, $\overline{\text{signal}}$ 102 is only able to reach a voltage level 106 which is far short of the voltage level maintained by signal 101 in its static state. In this example, peaks 105 and 106 at first pulse 104 are only separated by about 100 mV 107. This minimal voltage separation of 100 mV is to be contrasted with the much larger voltage differential of 500 mV before the first pulse occurred. Typically, a differential voltage of only 100 mV is not sufficient to allow a receiver to correctly determine a signal. However, after the first pulse, subsequent pulses 108, 110, 112, etc., are generally able to achieve a much greater voltage differential.

To address the first pulse problem, conventional drivers have typically applied precomp cutback in a single step with normal slew rate. Unfortunately, however, such precompensation technique typically introduces noise in the signal, thereby reducing noise margin. In addition, the single-step cutback approach generally produces jitters at the receiver end because the amount of precompensation does not match the attenuation of the transmission cable or bus.

In view of the foregoing, it would be desirable to have a differential driver for a bus that can precompensate transmission signals while reducing the noise and jitter.

SUMMARY OF THE INVENTION

The present invention fills these needs by providing a differential driver for a bus that precompensates transmission signals while reducing the noise and jitter. It should be appreciated that the present invention can be implemented in numerous ways, including as a process, an apparatus, a system, a device, a method, or a computer readable medium. Several inventive embodiments of the present invention are described below.

In one embodiment, the present invention provides a differential driver for transmitting signals. The differential driver includes a main buffer, a set of secondary buffers, and control logic circuitry. The main buffer is arranged to drive a first input differential signal for output as a differential output signal over a differential output line. The set of secondary buffers is arranged to receive second input differential signals, tristate signals, and mode signals with each secondary buffer receiving one second input differential signal, one tristate signal, and one mode signal. The secondary buffers are further configured to operate in a normal slew rate or a slow slew rate. Each tristate signal is configured to drive the associated secondary buffer to high impedance to turn off the associated secondary buffer when the tristate signal is asserted. Additionally, each secondary buffer is configured to operate in a slow slew rate in response to the associated mode signal. The control logic circuitry is arranged to receive input signals and a clock signal for generating the first input differential signal, second input differential signals, tristate signals, and the mode signals such that the secondary buffers cutback the differential output signal on the differential output line when the input signals are in a steady state for more than a specified number of clock cycles. In this configuration, the secondary buffers are arranged to cutback the differential output signal by tristating in response to the tristate signals and by operating in the slow slew rate in response to the mode signals.

In another embodiment, the present invention provides a differential driver for transmitting signals. The differential driver includes first driving means, second driving means, and control means. The first driving means is arranged to drive a first input differential signal for output as a differential output signal over a differential output line. The second driving means is arranged to cut back the differential output signal when the input signals are in a steady state for more than a specified clock cycles. The second driving means is further arranged to receive second input differential signals, tristate signals, and mode signals and is operable in a normal slew rate or a slow slew rate. The control means is arranged to receive input signals and a clock signal for generating the first input differential signal, second input differential signals, tristate signals, and the mode signals such that the second driving means cuts back the differential output signal on the differential output line when the input signals are in a steady state for at least a specified number of clock cycles. In this configuration, the second driving means cuts back the differential output signal by tristating in response to the tristate signals and by operating in the slow slew rate in response to the mode signals.

The differential driver of the present invention thus cuts back output signal gradually and slowly in stages to reduce noise and jitter in the transmission system while improving noise margin. The process of cutting back the output signal is achieved by alternating between the tristate and slow slew rate mode for subsequent clock periods during which the output signal remains in a steady state until a change in state occurs. When the first pulse is output after the steady state of preferably at least first three clock periods, the differential driver is able to drive the first pulse with normal power level and normal slew rate to remedy the first pulse problem. In so doing, the noise and jitter in the transmission system is substantially eliminated. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 8B shows a timing diagram of data signals d0in, d1in, d2in, and d3in generated by activity detection circuitry in accordance with one embodiment of the present invention.

FIG. 9B shows an exemplary timing diagram of the tristate signals and mode signals generated by a tri-state generator and mode signal generator in accordance with one embodiment of the present invention.

DETAILED DESCRIPTION OF THE PREFERRED EMBODIMENTS

The present invention provides a differential driver for a bus that precompensates transmission signals while reducing the noise and jitter. It will be obvious, however, to one skilled in the art, that the present invention may be practiced without some or all of these specific details. In other instances, well known process operations have not been described in detail in order not to unnecessarily obscure the present invention.

Figure 1:
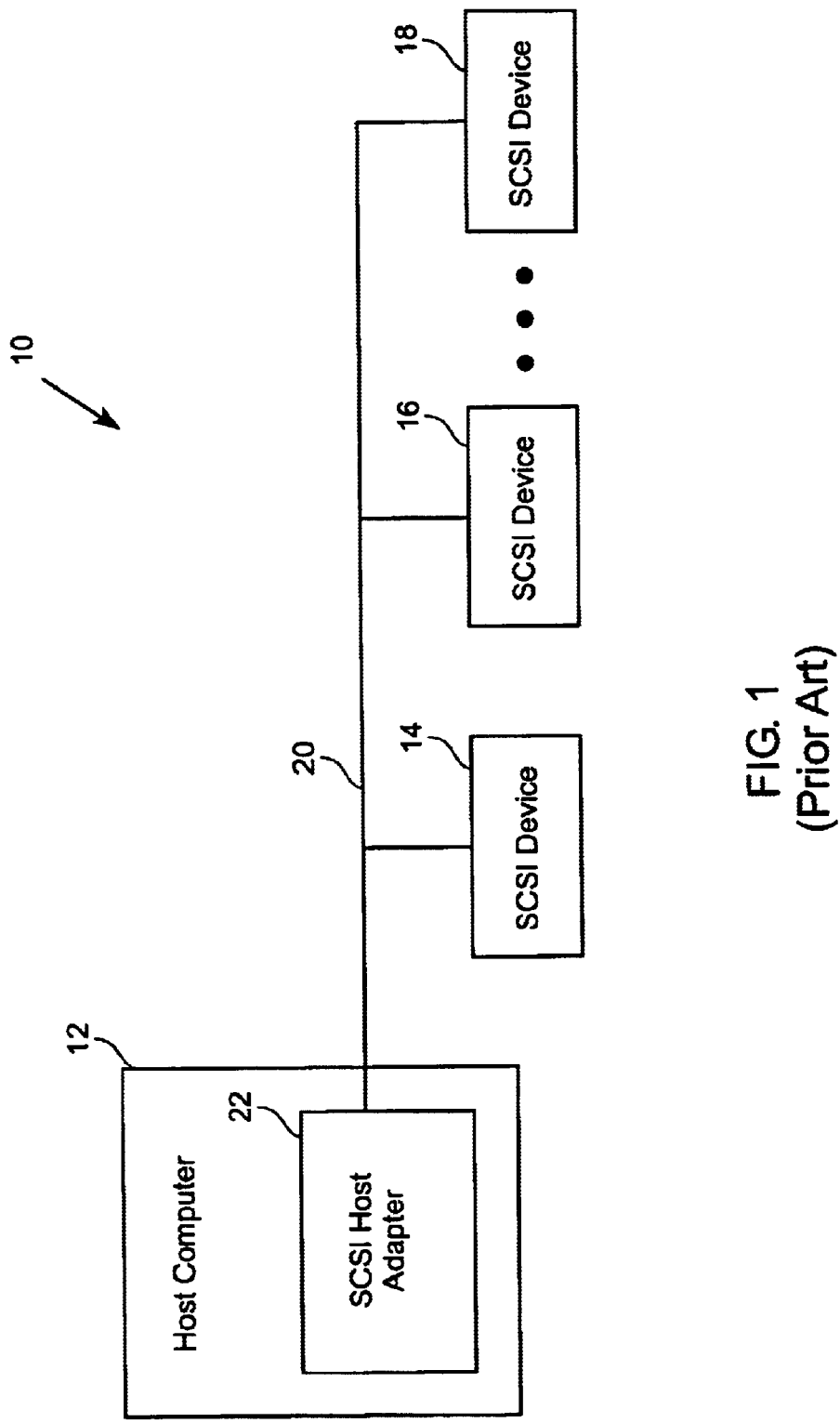
FIG. 1 shows a block diagram of a conventional computer system including a host computer, one or more SCSI devices, and a SCSI bus.
Figure 2:
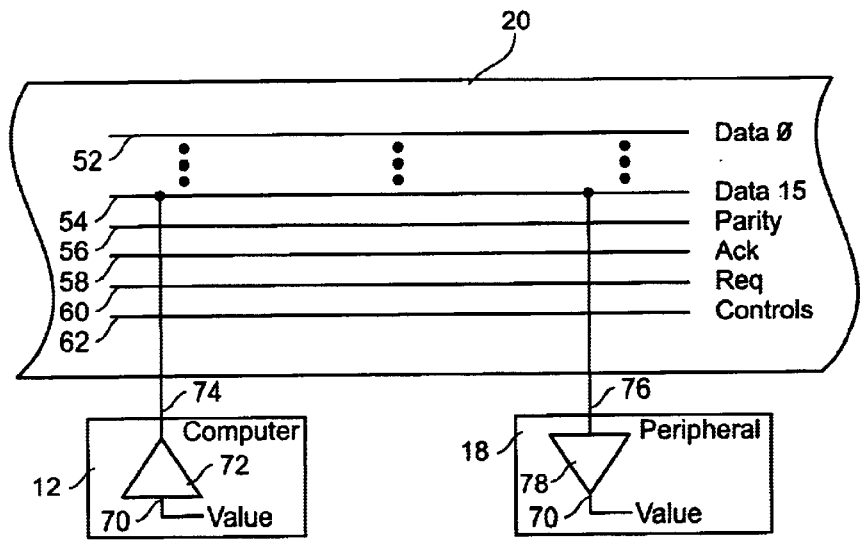
FIG. 2 shows a more detailed schematic diagram of the host computer and a peripheral device connected via the SCSI bus for driving and receiving a signal.
Figure 3:
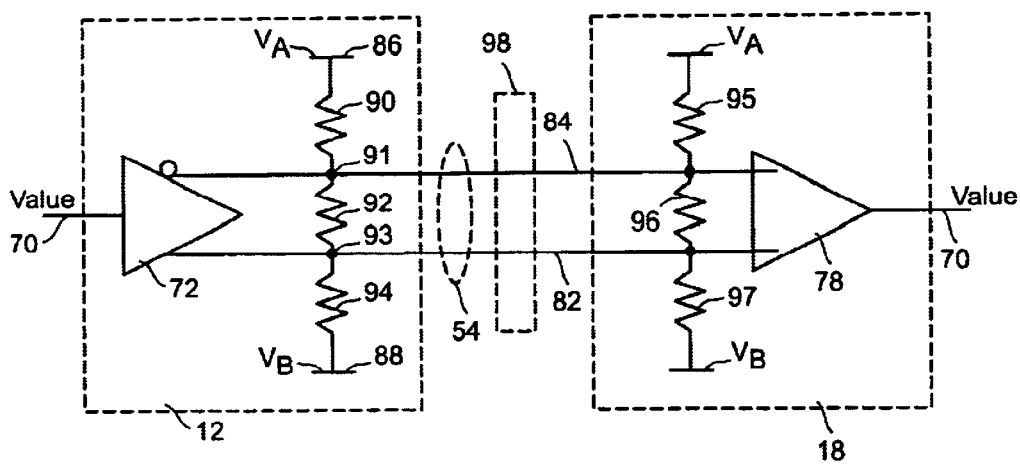
FIG. 3 shows a more detailed schematic circuit diagram of a driver and a receiver for transmitting a signal value over a differential line.
Figure 4:
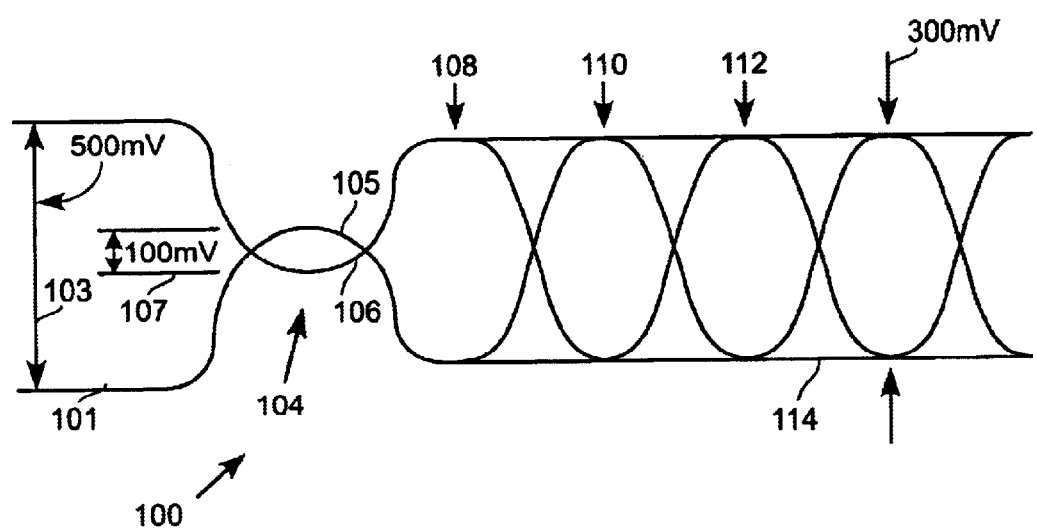
FIG. 4 shows a series of pulses for a signal coming from a driver of a low-voltage differential (LVD) SCSI bus.
Figure 5:
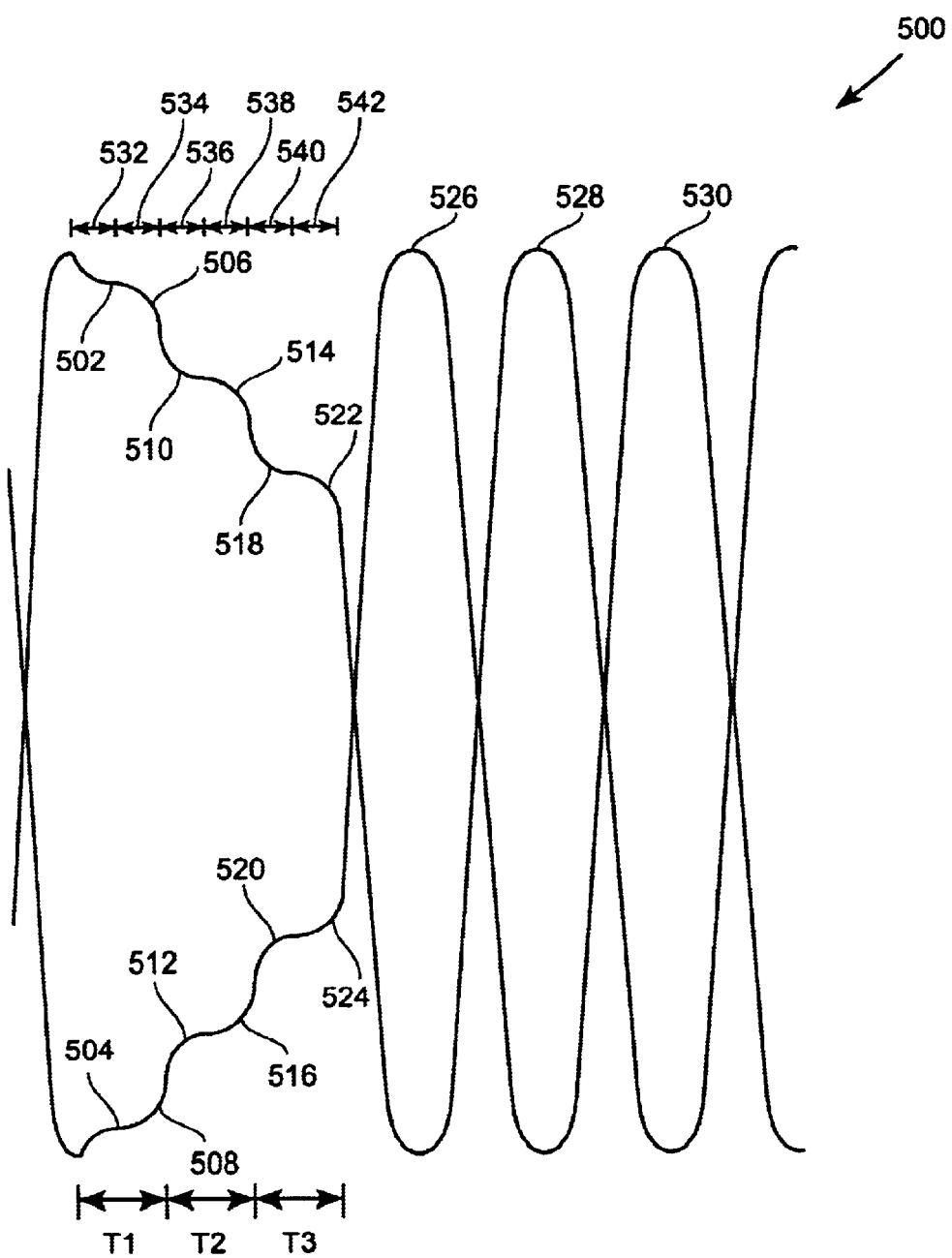
FIG. 5 shows a series of pulses depicting precompensation cutback of output signal voltages in accordance with one embodiment of the present invention.

FIG. 5 shows a series of pulses 500 depicting precompensation cutback of output signal voltages in accordance with one embodiment of the present invention. A driver apparatus for producing these pulses will be described in more detail below. The series of pulses 500 represent the differential output signal of the driver apparatus having precomp cutback feature and depicts the changing state of information being transmitted over a SCSI bus line.

The driver apparatus of the present invention looks ahead and monitors the state of input signals and applies precomp cutback when the state of the input signals has not changed for a specified number of clock cycles, preferably at least three clock cycles. In such cases, the output differential signal is cutback gradually and slowly in stages until the output differential signal changes state. In the illustrated example, the three input signals during the first three clock periods T1, T2, and T3 are in a steady state. In the first half 532 of the first clock period T1, the differential output signal cuts back slowly by tristating as represented by signal 502 and $\overline{signal}$ 504. Then, in the second half 534 of the first clock period T1, the differential output signal is further cutback by being driven down using a slow slew rate as shown by signal 506 and $\overline{signal}$ 508.

The process of cutting back the output signal continues by alternating between the tristate and slow slew rate mode for subsequent clock periods during which the output signal remains in a steady state until the first pulse 526 output. For example, during the first half 536 of the second clock period T2, the differential output signal represented by signals 510 and 512 is cut back by tristating. Then, the differential output signal of signals 514 and 516 is cutback further during a slow slew rate mode during the second half 538 of the second clock period T3. Similarly, for the first half 540 of the third clock period T3, the output signal is cut back by tristating as shown by signals 518 and 520. During the second half 542 of the third clock period T3, the output signal is further cutback by being driven in a slow slew rate mode as represented by signals 522 and 524. Preferably, the output signals are cutback in a non-linear fashion (e.g., decaying curve) and in slower amounts in subsequent stages to better match the attenuation characteristics of the transmission cable. However, the cutback may also be linear in some applications.

By gradually and slowly cutting back the output signal voltages in stages, the power to differential driver is gradually reduced. When the first pulse 526 is output after the steady state of the first three clock periods, the driver apparatus is able to drive the first pulse 526 with normal power level and normal slew rate to remedy the first pulse problem. In so doing, the noise and jitter in the transmission system is substantially eliminated. For the remaining output pulses 528, 530, etc., which change states, precomp cutback is not needed so that the driver apparatus operates with normal power and slew rate.

Figure 6:
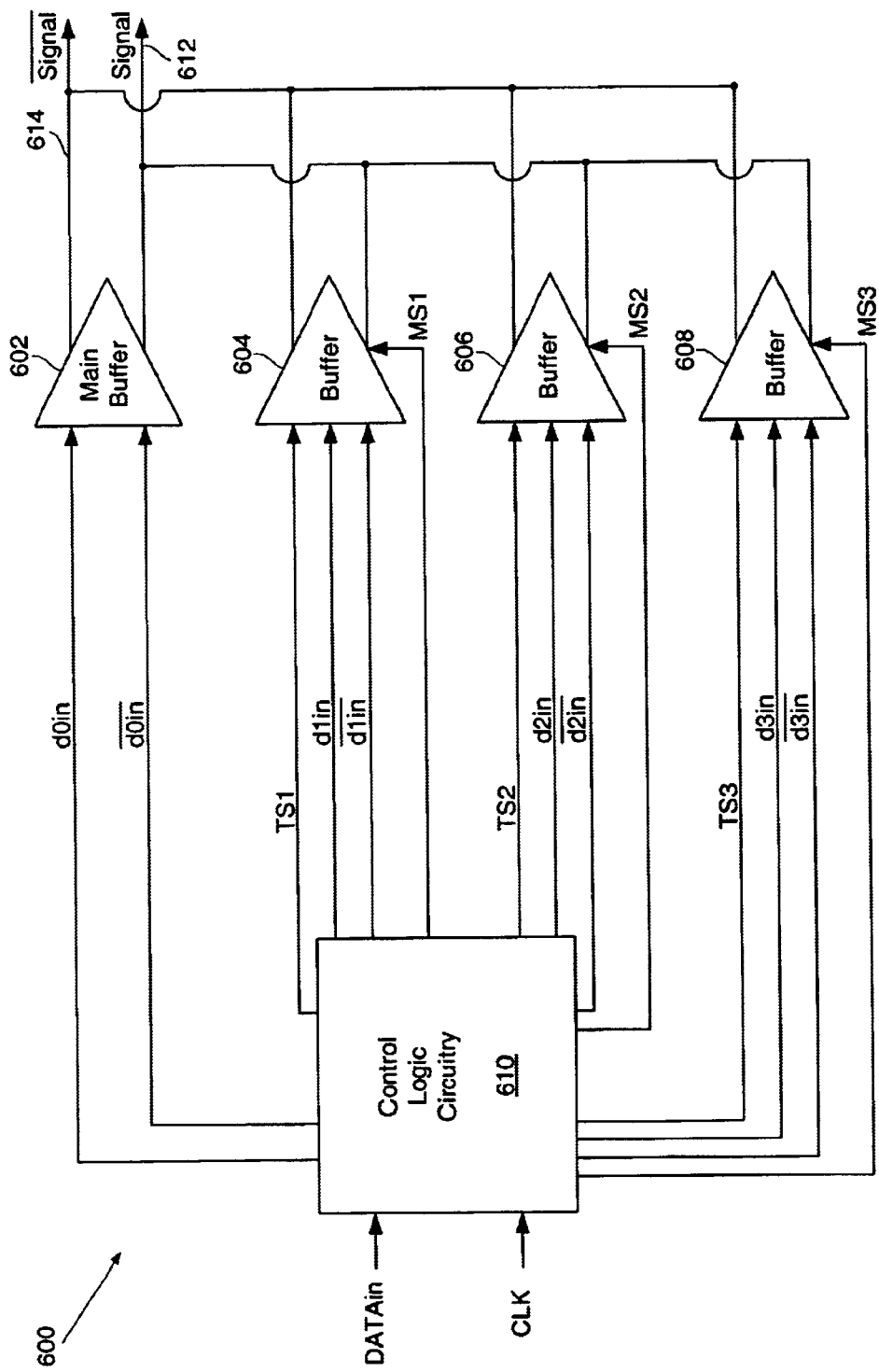
FIG. 6 shows a schematic diagram of an exemplary driver apparatus implementing a precomp cutback of the differential output signals in accordance with one embodiment of the present invention.

FIG. 6 shows a schematic diagram of an exemplary driver apparatus 600 implementing a precomp cutback of the differential output signals in accordance with one embodiment of the present invention. The driver apparatus 600 includes a main buffer 602, a set of secondary buffers 604, 606, and 608, and a control logic circuitry 610. The buffers 602, 604, 606, and 608 are coupled in parallel at their outputs and function to drive differential input signals for output. The buffers 602, 604, 606, and 608 may be implemented using any conventional drivers, op amps, etc. Although the driver apparatus 600 is illustrated using such buffer configuration, it may be implemented using any number of secondary buffers.

The control logic circuitry 610 receives input data signals DATAin and a clock signal CLK. The driver apparatus 610 is configured to look ahead and monitor the input signals to determine when to generate the output control signals for applying precomp cutback when the state of the input signals will not change for a specified number of clock cycles. In response to the DATAin and CLK signals, the control logic circuitry 610 generates data signals and control signals. Specifically, it is configured to generate data signals d0in, $\overline{d0in}$, d1in $\overline{d1in}$, d2in, $\overline{d2in}$, d3in, and $\overline{d3in}$ for input to the buffers 602, 604, 606, and 608 as data signals. In addition, the control logic circuitry 610 is configured to produce tristate signals TS1, TS2, and TS3 and mode signals MS0, MS1, MS2, and MS3. The tristate signals TS1, TS2, and TS3 are provided to buffers 604, 606, and 608, respectively, to tristate the respective buffers. Each of the tristate signals operates to drive the associated buffer into a high impedance state, thereby turning off the buffer.

Similarly, the mode signals MS0, MS1, MS2, and MS3 are provided to the buffers 602, 604, 606, and 608 to control the slew rate mode of the respective buffers. In normal slew rate mode, for example, the buffers may operate at about 1.5 ns slew rate. In slow slew rate mode, the buffers operate at about 3 ns slew rate for each cutback step. When the mode signal is asserted, a secondary buffer operates in a slow slew rate for applying precomp cutback to the output differential signal. Accordingly, the output signal will be a gradual slop while being cutback, thereby eliminating high frequency noise and jitter.

The main buffer 602 functions as the primary driver to output signal and $\overline{signal}$ on output lines 612 and 614, respectively, in response to the data signals d0in and $\overline{d0in}$ from the control logic circuitry 610. The main buffer 602 is augmented by the secondary buffers 604, 606, and 608, the outputs of which are coupled in parallel to the output lines 612 and 614. The secondary buffers 604, 606, and 608 function to cutback the output signals gradually in stages when the state of the input signal will not change for a specified number of clock cycles, preferably at least three clock cycles.

The control logic circuitry 610 receives and examines the input data signal DATAin and clock signal CLK ahead of time to determine if the input data signal will have a steady state of at least three clock cycles. To enable such look ahead feature for cutback, the control logic circuitry 610 generates various delayed versions of the original data signal DATAin for input to the buffers 602, 604, 606, and 608. More specifically, it generates the data signals d0in, $\overline{d0in}$, d1in, $\overline{d1in}$, d2in, $\overline{d2in}$, d3in, and $\overline{d3in}$ for input to the buffers 602, 604, 606, and 608. In one embodiment, the signal d0in is the DATAin signal delayed by 2 clocks and signal $\overline{d0in}$ is its complement signal. In turn, the signal d1in is $\overline{d0in}$ with one clock delay. Signal d2in is $\overline{d0in}$ with two clock delays, except when d0in changes, then d2in will change state at the same time. Finally, signal d3in is $\overline{d0in}$ with three clock delays, except when d0in changes, then d3in will change state at the same time.

The secondary buffer 604 is arranged to receive the tristate signal TS1, mode signal MS1, and data signals d1in and $\overline{d1in}$ from the control logic circuitry 610. Similarly, the secondary buffer 606 receives the tristate signal TS2, mode signal MS2, and data signals d2in and $\overline{d2in}$ from the control logic circuitry 610. Likewise, the secondary buffer 608 is arranged to receive the tristate signal TS3, mode signal MS3, and data signals d3in and $\overline{d3in}$ from the control logic circuitry 610.

The secondary buffers 604, 606, and 608 may be configured with various cutback parameters to achieve desired cutback characteristics. For example, the buffer 604 may be designed operate at half the frequency rate of the main buffer 602 to cutback the output signal by 17%. Similarly, the buffer 606 may be arranged to operate at half the frequency rate of the buffer 604 to cutback the output by 12%. Likewise, the buffer 608 can be designed to operate at half the frequency of the buffer 606 to cutback the output by 8%.

Figure 7:
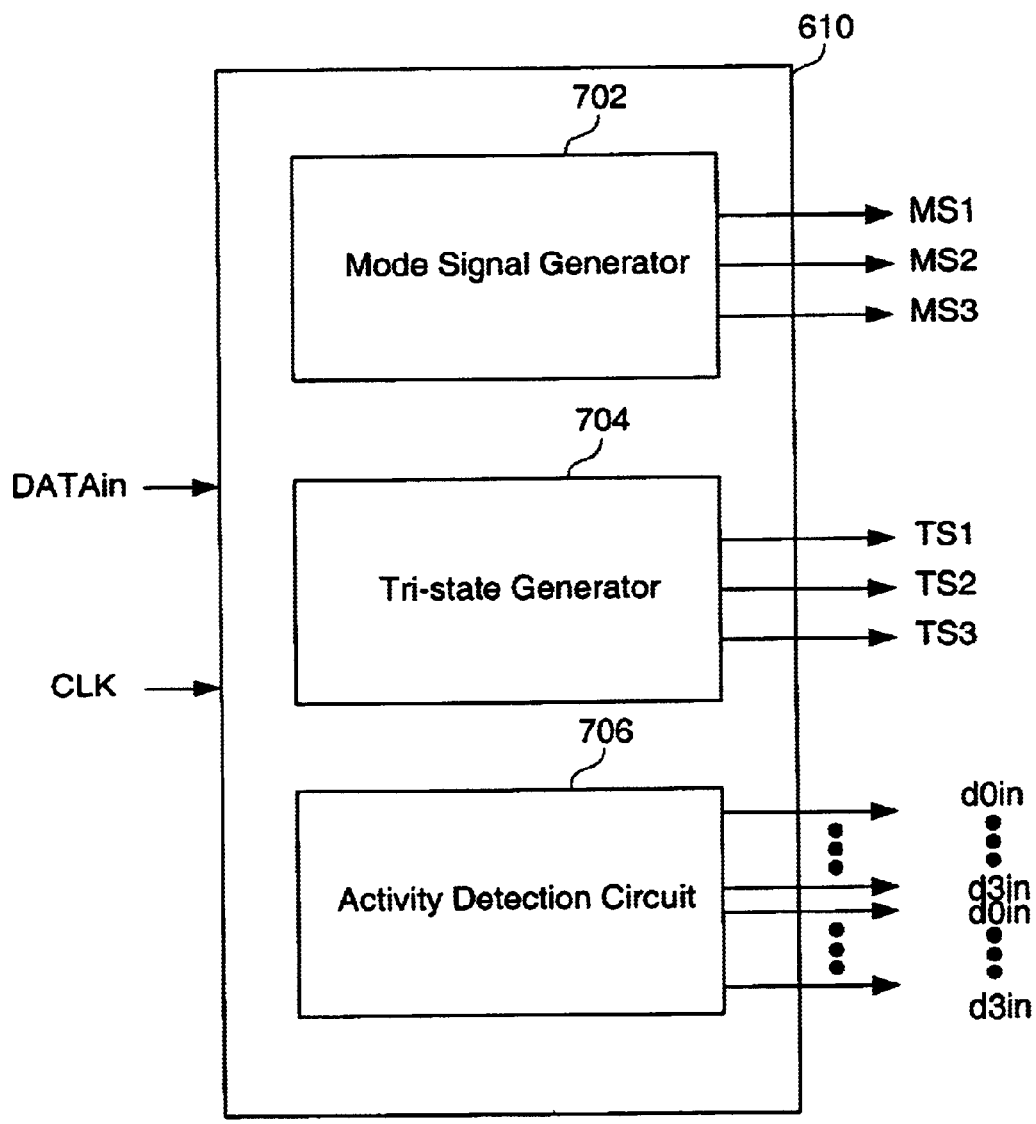
FIG. 7 shows a more detailed block diagram of control logic circuitry in accordance with one embodiment of the present invention.

FIG. 7 shows a more detailed block diagram of the control logic circuitry 610 in accordance with one embodiment of the present invention. The control logic circuitry 610 includes a mode signal generator 702, a tri-state generator 704, and an activity detection circuit 706. The mode signal generator 702 generates the mode signals MS1, MS2, and MS3, which are provided to the secondary buffers 604, 606, and 608, respectively. To tristate the output signal, the tri-state generator 704 generates the tristate signals TS1, TS2, and TS3, which are fed to the secondary buffers 604, 606, and 608, respectively. To provide input data signals for buffers 602, 604, 606, and 608, the activity detection circuit 706 generates the data signals d0in, $\overline{d0in}$, d1in, $\overline{d1in}$, d2in, $\overline{d2in}$, d3in, and $\overline{d3in}$.

Figure 8A:
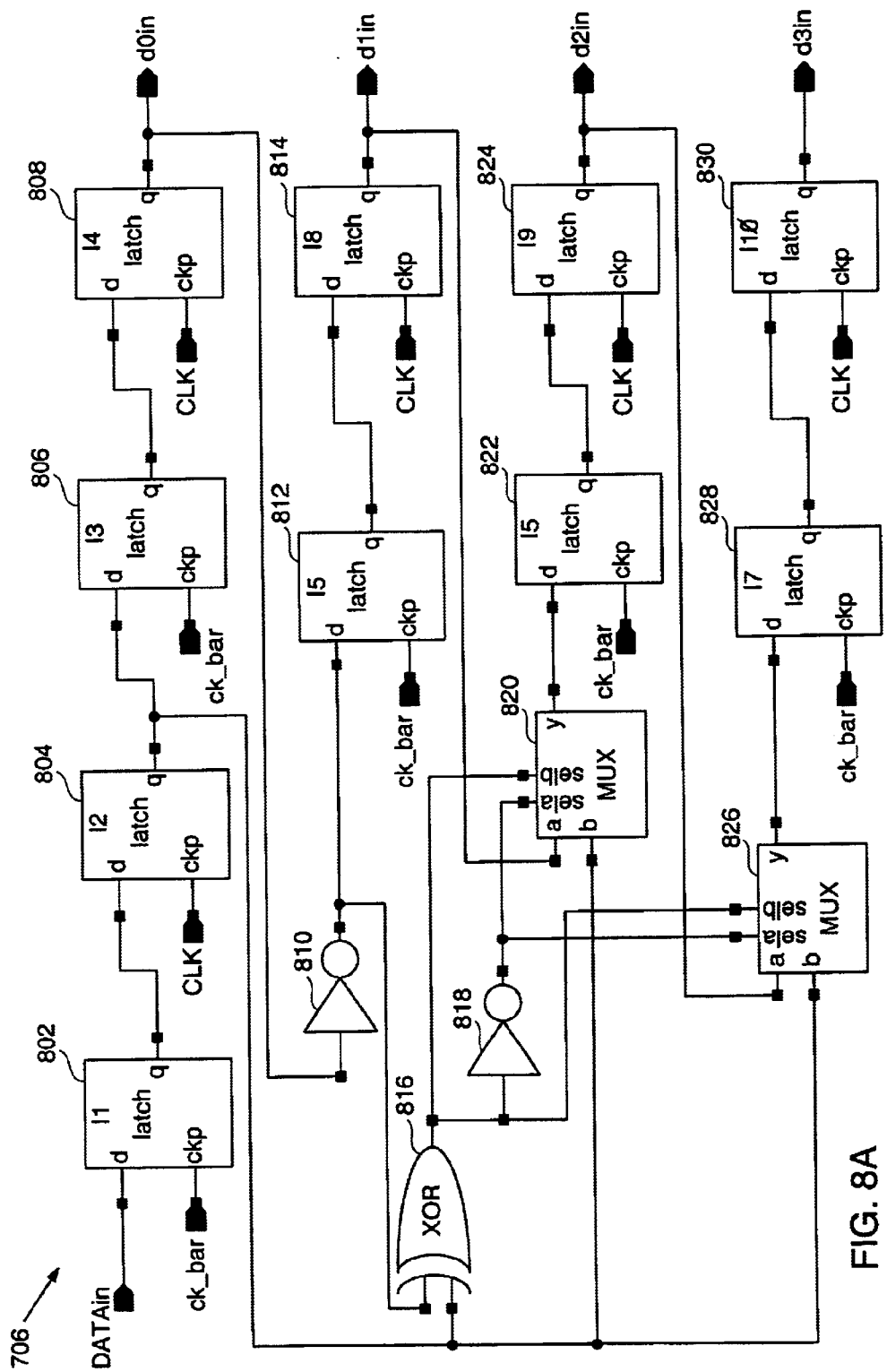
FIG. 8A illustrates a more detailed diagram of the activity detection circuit in accordance with one embodiment of the present invention.

FIG. 8A illustrates a more detailed diagram of the activity detection circuit 706 in accordance with one embodiment of the present invention. The activity detection circuit 706 includes five delay stages with each delay stage delaying an input signal by one clock cycle. Each delay stage is implemented using a pair of latches to form a flip-flop. For ease of understanding, the illustrated activity detection circuit 706 is shown to generate non-inverting input data signals d0in, d1in, d2in, and d3in. However, those skilled in the art will readily appreciate that it may also be used to generate inverting input data signals $\overline{d0in}$, $\overline{d1in}$, $\overline{d2in}$, and $\overline{d3in}$ with minor modifications such as addition of inverters.

The first delay stage includes latches 802 and 804, which receive an inverted clock signal ck_bar and non-inverted clock signal clk, respectively. The latch 802 receives DATAin and outputs the signal with a half cycle delay for input to the latch 804. The latch 804 then outputs the signal DATAin with a half cycle delay. Thus, the first stage outputs the DATAin signal that is delayed by one clock cycle. The first delay stage is optional in that it is provided in the activity detection circuit 706 to allow the activity detection circuit 706 to operate properly with the mode signal generator 702 and tri-state generator 704.

The second delay stage includes latches 806 and 808 and delays the output signal (i.e., DATAin signal with one clock delay) from the first delay stage by another clock cycle. The delayed signal, which is the DATAin signal with two clock delays, from the second delay stage is then output as d0in, which is provided to the main buffer 602.

The d0in signal is then provides to an inverter 810, which inverts the d0in signal to produce $\overline{d0in}$ signal. This inverted signal is then provided as input to the third delay stage that includes latches 812 and 814. The latch 814 in the third delay stage then outputs d1in, which is $\overline{d0in}$ with one clock delay, for input to the secondary buffer 604.

To produce d2in signal, an XOR gate combines the output from the inverter 318 and d0in to produce an output signal, which is provided to an inverter 818 and a multiplexer 812. The inverter 818 inverts the output signal from the XOR gate 816 and provides the inverted signal as a cutback signal to the multiplexer 820. The multiplexer 820 receives d0in and d1in signals and selects one of these signals for output. For example, when data signal remains the same, the cutback signal from the inverter 818 is used to select d1in for output. On the other hand, if the data changes, the signal from the XOR gate 816 is used to select d0in for output. The multiplexer 820 then provides the output signal to the fourth delay stage having latches 822 and 824. The latch 824 in the fourth stage then outputs d2in for input to the secondary buffer 606. In so doing, the d2in signal will be d0in with two clock delays if d0 remains the same. However, if d0in changes, then d2in signal will change at the same time.

For generating d3in signal, a multiplexer 826 receives the cutback signal from the inverter 818 and the output signal from the XOR gate as control signals. The multiplexer 826 is arranged to receive d0in and d2in signals as data signals and selects one of these signals in response to the control signals. For example, when data signal remains the same, the cutback signal from the inverter 818 is used to select d2in for output. On the other hand, if the data changes, the signal from the XOR gate 816 is used to select d0in for output. The multiplexer 826 then provides the output signal to the fifth delay stage having latches 828 and 830. The latch 830 in the fifth stage then outputs d3in for input to the secondary buffer 608. In this manner, the d3in signal will be d0in with three clock delays if d0 remains the same. However, if d0in changes, then d2in signal will change at the same time.

FIG. 8B shows a timing diagram 850 of the data signals d0in, d1in, d2in, and d3in generated by the activity detection circuitry 610 in accordance with one embodiment of the present invention. The signal d0in is DATAin signal delayed by 2 clocks. The signal d1in is $\overline{d0in}$ with one clock delay. Signal d2in is $\overline{d0in}$ with two clock delays, except when d0in changes, then d2in will change state at the same time. Finally, signal d3in is $\overline{d0in}$ with three clock delays, except when d0in changes, then d3in will change state at the same time.

Figure 9A:
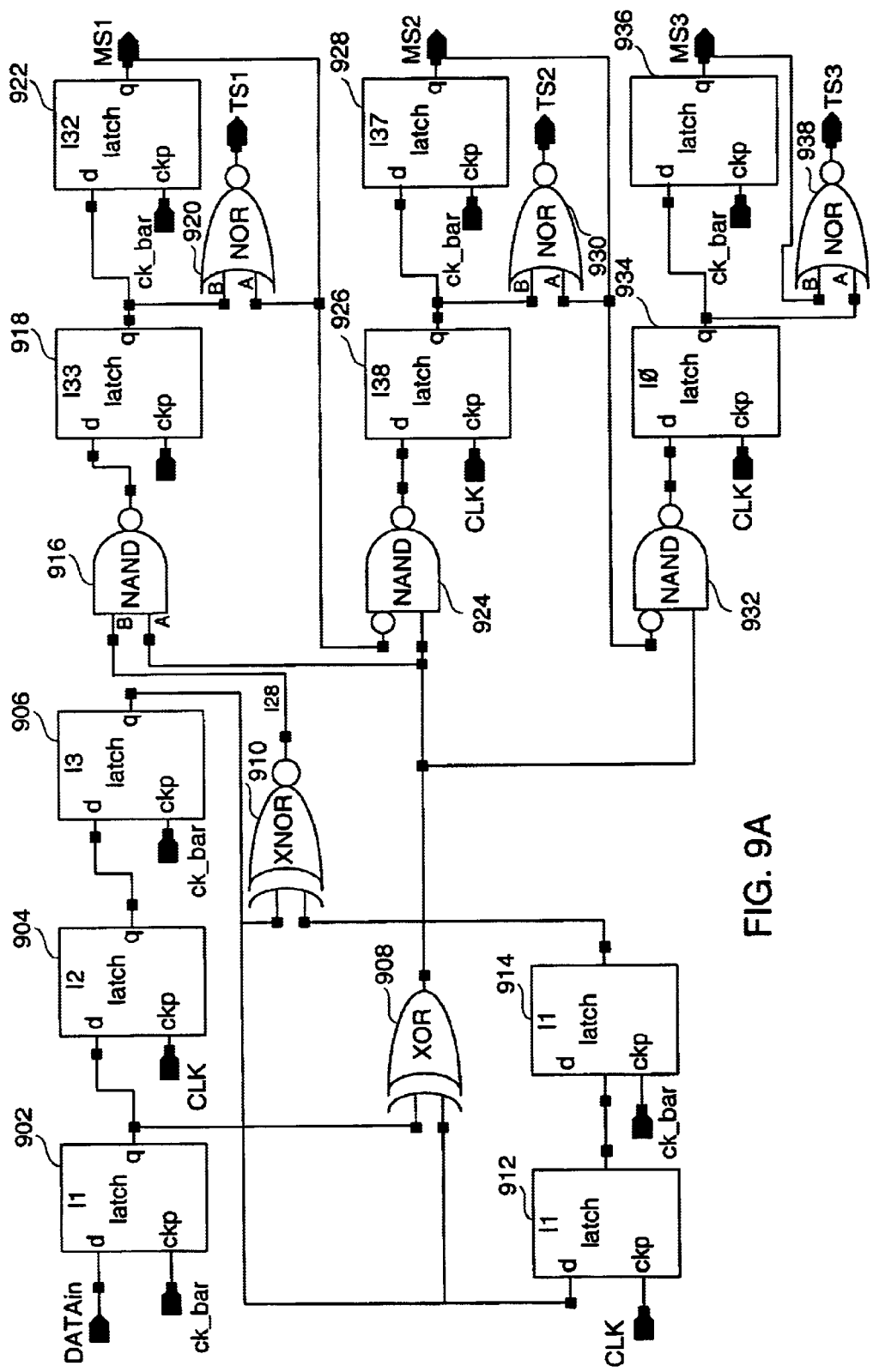
FIG. 9A illustrates a more detailed circuit diagram of a mode signal generator and tri-state generator in accordance with one embodiment of the present invention.

FIG. 9A illustrates a more detailed circuit diagram of the mode signal generator 702 and tri-state generator 704 in accordance with one embodiment of the present invention. In this embodiment, the mode signal generator 702 and tri-state generator 704 share four delay stages with each delay stage having a pair of latches. However, the mode signal generator 702 and tri-state generator 704 may also be implemented as separate units without sharing the delay stages.

As described above, the mode signal generator 702 generates mode signals MS1, MS2, and MS3, while the tri-state generator 704 produces tristate signals TS1, TS2, and TS3. To generate these signals, the first delay stage includes latches 902 and 904 that function as a flip-flop to output DATAin signal after one clock delay. Specifically, the latch 902 receives the DATAin signal and outputs the DATAin signal after a half clock delay in response to the complement of CLK signal, ck_bar. The output from the latch 902 is then provided to the latch 904, which outputs the input signal as output after a half clock delay in response to the CLK signal.

The output from the latch 906 is provided to an XNOR gate 910, an XOR gate 908, and a latch 912. The XOR gate 908 combines the output signal from the latch 906 with the output signal from the latch 902 to produce an output signal. The latch 912 outputs the signal from the latch 906 after a half clock delay for input to a latch 914. The latch 914 then outputs the delayed clock for input to the XNOR gate 910. The XNOR gate combines the input signals from the latches 906 and 914 to produce an output signal. The NAND gate 916 then combines the input signals from the XNOR gate 910 and the XOR gate 908 to produce an output, which is fed to the latch 918. In this configuration, the second stage outputs the signal from the NAND gate 916 via latch 918.

The output from latch 918 is then provided to latch 922 and NOR gate 920 as an input. The latch 922 outputs the input signal as MS1 signal, which is fed into the NOR gate 920 as another input. The NOR gate 920 then produces TS1 signal for output to buffer 604. A NAND gate 924 receives the MS1 signal from the latch 922 and the output of the XOR gate 908 to produce an output signal that is fed into a latch 926. The NOR gate 920 and latches 922 and 926 form a third delay stage.

The latch 926 then outputs the input signal for input to a latch 928 and a NOR gate 930. The latch 928 then produces MS2 signal at its output, which is fed into the NOR gate 930 and a NAND gate 932. The NOR gate 930 then produces TS2 signal that is provided to the buffer 606.

The NAND gate 932 receives the output of the XOR gate 908 and the MS2 signal to produce an output, which is fed into a latch 934. The NOR gate 930 together with latches 928 and 934 form the fourth delay stage. The latch 934 in the fourth delay stage outputs the signal from the NAND gate with one-half cycle delay for input to a latch 936 and a NOR gate 938. The latch 936 then produces MS3 signal for the buffer 608. The NOR gate receives the MS3 signal and the output from the latch 934 to generate TS3 signal, which is provided to the buffer 608.

FIG. 9B shows an exemplary timing diagram 950 of the tristate signals and mode signals generated by the tri-state generator 704 and mode signal generator 702 in accordance with one embodiment of the present invention. The tri-state generator 704 generates TS1 signal during time 952 to drive the buffer 604 to high impedance, thereby cutting back in the output signal. After the TS1 signal is deasserted, the MS1 signal during time 958 causes the buffer 604 to operate in a slow slew rate so that the output signal is cut back further.

Then, during time 954, TS2 signal is generated to drive the buffer 606 to high impedance so that the output signal is further cutback. Immediately afterwards, the MS2 signal causes the buffer 606 to operate in the slow slew rate during time 960. This has the effect of cutting back the output signal further. Then, the TS3 signal is asserted during time 956 to drive the buffer 608 into high impedance. This causes the output signal to be cut back further. The MS3 signal during time 962 then causes the buffer 608 to run in the slew rate so that the output signal is cut back further. In so doing, the noise and jitter in the transmission system is substantially reduced.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A differential driver for transmitting signals, comprising:
    a main buffer arranged to drive a first input differential signal for output as a differential output signal over a differential output line;
    a set of secondary buffers arranged to receive second input differential signals, tristate signals, and mode signals, each secondary buffer receiving one second input differential signal, one tristate signal, and one mode signal, the secondary buffers being configured to operate in a normal slew rate or a slow slew rate, each tristate signal being configured to drive the associated secondary buffer to high impedance to turn off the associated secondary buffer when the tristate signal is asserted, wherein each secondary buffer is configured to operate in a slow slew rate in response to the associated mode signal; and
    control logic circuitry arranged to receive input signals and a clock signal for generating the first input differential signal, second input differential signals, tristate signals, and the mode signals such that the secondary buffers cutback the differential output signal on the differential output line when the input signals are in a steady state for more than a specified number of clock cycles, and wherein the secondary buffers are arranged to cutback the differential output signal by tristating in response to the tristate signals and by operating in the slow slew rate in response to the mode signals.

2. The differential driver as recited in claim 1, wherein the control logic circuitry further includes:
    an activity detection circuit arranged to receive the input signals and the clock signal for generating the first and second input differential signals;
    a mode signal generator arranged to receive the input signals and the clock signal for generating the mode signals; and
    a tri-state generator arranged to receive the input signals and the clock signal for generating the tristate signals.

3. The differential driver as recited in claim 1, wherein each of the secondary buffers is configured to cutback the output signal by a specified amount.

4. The differential driver as recited in claim 1, wherein the activity detection circuit delays the input signal by two clock cycles to generate the first input differential signal.

5. The differential driver as recited in claim 4, wherein second input differential signals are derived from the first input differential signal by delaying the complement of the first input differential signal.

6. The differential driver as recited in claim 1, wherein the secondary buffers are configured to operate in the tristate and slow slew rate one at a time.

7. The differential driver as recited in claim 1, wherein all the buffers are configured to operate in the normal slew rate when the input signal is not in a steady state.

8. A precompensation differential driver apparatus, comprising:
    a first buffer arranged to drive a first differential input signal for output as a differential output signal over a differential output line;
    a plurality of secondary buffers arranged to receive second differential input signals, tristate signals, and mode signals, each secondary buffer receiving one of the second differential input signals, one tristate signal, and one mode signal, the secondary buffers being configured to operate in a normal slew rate or a slow slew rate, each tristate signal being configured to drive the associated secondary buffer to high impedance, wherein each secondary buffer is configured to operate in a slow slew rate in response to the associated mode signal; and
    control logic circuitry arranged to receive input signals and a clock signal for generating the first differential input signal, second differential input signals, tristate signals, and the mode signals such that the secondary buffers cutback the differential output signal on the differential output line when the input signals are in a steady state for more than three clock cycles, and wherein the secondary buffers are arranged to cutback the differential output signal by tristating in response to the tristate signals and by operating in the slow slew rate in response to the mode signals.

9. The precompensation differential driver apparatus as recited in claim 8, wherein the control logic circuitry further includes:
    an activity detection circuit arranged to receive the input signals and the clock signal for generating the first and second differential input signals;
    a mode signal generator arranged to receive the input signals and the clock signal for generating the mode signals; and
    a tri-state generator arranged to receive the input signals and the clock signal for generating the tristate signals.

10. The precompensation differential driver apparatus as recited in claim 8, wherein each of the secondary buffers is configured to cutback the output signal by a specified amount.

11. The precompensation differential driver apparatus as recited in claim 8, wherein the activity detection circuit delays the input signal by two clock cycles to generate the first input differential signal.

12. The precompensation differential driver apparatus as recited in claim 11, wherein second input differential signals are derived from the first input differential signal by delaying the complement of the first input differential signal.

13. The precompensation differential driver apparatus as recited in claim 8, wherein the secondary buffers are configured to operate in the tristate and slow slew rate one at a time.

14. The precompensation differential driver apparatus as recited in claim 8, wherein all the buffers are configured to operate in the normal slew rate when the input signal is not in a steady state.

15. A differential driver for transmitting signals, comprising:

first driving means for driving a first input differential signal for output as a differential output signal over a differential output line;

second driving means for cutting back the differential output signal when the input signals are in a steady state for more than a specified clock cycles, the second driving means being arranged to receive second input differential signals, tristate signals, and mode signals and being operable in a normal slew rate or a slow slew rate; and control means arranged to receive input signals and a clock signal for generating the first input differential signal, second input differential signals, tristate signals, and the mode signals such that the second driving means cuts back the differential output signal on the differential output line when the input signals are determined to be in a steady state for at least a specified number of clock cycles, and wherein the second driving means cuts back the differential output signal by tristating in response to the tristate signals and by operating in the slow slew rate in response to the mode signals.

16. The differential driver as recited in claim 15, wherein the first driving means is a first differential buffer.

17. The differential driver as recited in claim 16, wherein the second driving means includes:

a set of second buffers arranged to receive the second differential input signals, tristate signals, and mode signals, each second buffer receiving one second input differential signal, one tristate signal, and one mode signal and being configured to operate in a normal slew rate or a slow slew rate, each tristate signal being configured to drive the associated second buffer to high impedance, wherein each second buffer is configured to operate in a slow slew rate in response to the associated mode signal.

18. The differential driver as recited in claim 16, wherein the control means further includes:

an activity detection circuit arranged to receive the input signals and the clock signal for generating the first and second differential input signals;

a mode signal generator arranged to receive the input signals and the clock signal for generating the mode signals; and a tri-state generator arranged to receive the input signals and the clock signal for generating the tristate signals.

19. The differential driver as recited in claim 16, wherein the second driving means is configured to cutback the output signal in multiple steps.

20. The differential driver as recited in claim 18, wherein the activity detection circuit delays the input signal by two clock cycles to generate the first differential input signal.

21. The differential driver as recited in claim 20, wherein second differential input signals are derived from the first input differential signal by inverting and delaying the first input differential signal.

22. The differential driver as recited in claim 17, wherein the second buffers are configured to operate in the tristate and slow slew rate one at a time.

23. The differential driver as recited in claim 17, wherein all the buffers are configured to operate in the normal slew rate when the input signal is not in the steady state.

\* \* \* \* \*